(12) United States Patent
Abe et al.

(10) Patent No.: US 10,283,981 B2
(45) Date of Patent: May 7, 2019

(54) PROTECTION IC AND SEMICONDUCTOR INTEGRATED CIRCUIT

(71) Applicants: MITSUMI ELECTRIC CO., LTD., Tokyo (JP); ITM Semiconductor Co., Ltd., Chungcheongbuk-do (KR)

(72) Inventors: Shuhei Abe, Tokyo (JP); Hyuk Hwi Na, Chungcheongbuk-do (KR); Ho Seok Hwang, Gyeonggi-do (KR); Young Seok Kim, Chungcheongbuk-do (KR); Sang Hoon Ahn, Chungcheongbuk-do (KR)

(73) Assignees: MITSUMI ELECTRIC CO., LTD., Tokyo (JP); ITM Semiconductor Co., Ltd., Chungcheongbuk-do (KR)

( * ) Notice: Subject to any disclaimer, the term of this patent is extended or adjusted under 35 U.S.C. 154(b) by 0 days.

(21) Appl. No.: 15/640,699

(22) Filed: Jul. 3, 2017

(65) Prior Publication Data
US 2018/0013298 A1    Jan. 11, 2018

(30) Foreign Application Priority Data

Jul. 11, 2016 (JP) ................................. 2016-137099

(51) Int. Cl.
*H02J 7/00* (2006.01)
*H01L 23/535* (2006.01)
(Continued)

(52) U.S. Cl.
CPC .......... *H02J 7/0029* (2013.01); *H01L 23/535* (2013.01); *H01L 27/0266* (2013.01);
(Continued)

(58) Field of Classification Search
CPC .. H02J 7/0031; H02J 2007/004; H02J 7/0029; H02J 2007/0039; H02J 7/0026; H02J 7/0024; H01M 2200/00
(Continued)

(56) References Cited

U.S. PATENT DOCUMENTS

| 5,536,977 A | 7/1996 | Williams |
| 2006/0076931 A1* | 4/2006 | Mandai ................. H02J 7/0031 320/134 |

(Continued)

FOREIGN PATENT DOCUMENTS

| JP | H08-037302 | 2/1996 |
| JP | 2007-068390 | 3/2007 |

(Continued)

OTHER PUBLICATIONS

Japanese Office Action for 2016-137099 dated Dec. 4, 2018.

*Primary Examiner* — Nghia M Doan
(74) *Attorney, Agent, or Firm* — IPUSA, PLLC

(57) ABSTRACT

A protection IC includes a bias output terminal connected to a back gate of a MOS transistor, a load side terminal connected to a power supply path between a load and the MOS transistor, a load side switch inserted in an electric current path connecting the bias output terminal and the load side terminal, and a control circuit configured to control the load side switch based on a state of a secondary battery and thereby cause a back gate control signal for controlling a voltage of the back gate to be output from the bias output terminal. The load side switch is formed on an N-type silicon substrate and includes at least two NMOS transistors whose drains are connected to each other, and the control circuit is configured to simultaneously turn on or turn off the two NMOS transistors based on the state of the secondary battery.

6 Claims, 8 Drawing Sheets

(51) Int. Cl.
*H01L 27/088* (2006.01)
*H03K 17/16* (2006.01)
*H03K 17/06* (2006.01)
*H01L 27/02* (2006.01)

(52) U.S. Cl.
CPC ........ *H01L 27/0274* (2013.01); *H01L 27/088* (2013.01); *H02J 7/0031* (2013.01); *H03K 17/063* (2013.01); *H03K 17/162* (2013.01); H02J 2007/004 (2013.01); H02J 2007/0037 (2013.01); H02J 2007/0039 (2013.01); H03K 2217/0018 (2013.01); H03K 2217/0036 (2013.01)

(58) Field of Classification Search
USPC .................................................. 320/134, 136
See application file for complete search history.

(56) References Cited

U.S. PATENT DOCUMENTS

| | | | | |
|---|---|---|---|---|
| 2009/0121683 A1* | 5/2009 | Goto | .................... | H01M 10/48 320/134 |
| 2012/0056593 A1 | 3/2012 | Sakurai et al. | | |
| 2018/0013299 A1* | 1/2018 | Abe | .................... | H02J 7/0031 |

FOREIGN PATENT DOCUMENTS

| | | |
|---|---|---|
| JP | 2008-079354 | 4/2008 |
| JP | 2012-060762 | 3/2012 |

* cited by examiner

PROTECTION IC AND SEMICONDUCTOR INTEGRATED CIRCUIT

CROSS-REFERENCE TO RELATED APPLICATION

The present application is based upon and claims the benefit of priority of Japanese Patent Application No. 2016-137099, filed on Jul. 11, 2016, the entire contents of which are incorporated herein by reference.

BACKGROUND OF THE INVENTION

1. Field of the Invention

An aspect of this disclosure relates to a protection IC and a semiconductor integrated circuit.

2. Description of the Related Art

There are known protection circuits that protect secondary batteries by turning off switching elements inserted between the secondary batteries and loads on power supply paths (See, for example, Japanese Patent No. 4522384).

FIG. 1 is a diagram illustrating a configuration of a protection circuit 12 disclosed in Japanese Patent No. 4522384. When a secondary battery 11 is coupled to a battery charger 15, a control circuit 14 sets a gate voltage of a switching element 13 at an ON voltage of the switching element 13. At this time, as illustrated in FIG. 1, a voltage of a back gate contact 21 is set at a drain voltage.

When a voltage of the secondary battery 11 becomes greater than a highest set voltage, the control circuit 14 sets the gate voltage of the switching element 13 at a cut-off voltage. As a result, while a charging current is blocked by the switching element 13 and a diode 26B of parasitic diodes 26, a discharging current flows via the diode 26B when the secondary battery 11 is coupled to the load 16.

On the other hand, when the voltage of the secondary battery 11 becomes less than a lowest set voltage, the control circuit 14 sets the gate voltage of the switching element 13 at a cut-off voltage, and switches the voltage of the back gate contact 21 from the drain voltage to a source voltage. As a result, while a discharging current is blocked by the switching element 13 and a diode 26A of the parasitic diodes 26, a charging current flows via the diode 26A when the secondary battery 11 is coupled to the battery charger 15.

The control circuit 14 switches a changeover switch SW to the side of a terminal Vss or the side of a terminal Vm1, and thereby sets the voltage of the back gate contact 21 at the same level as the source or drain voltage of the switching element 13.

FIG. 2 is a diagram illustrating an example of a circuit that selectively switches a voltage of a terminal 194 to a voltage of a terminal 192 or a voltage of a terminal 195. The terminal 194 is an example of a bias output terminal that is coupled to a back gate of a MOS (metal oxide semiconductor) transistor, the terminal 192 is an example of a VSS terminal that is coupled to a negative electrode of an power source, and the terminal 195 is an example of a V-terminal that is connected to a negative terminal of the load.

The control circuit 198 turns on a switch 141 by turning on a transistor 174, thereby switching the voltage of the terminal 194 to the voltage of the terminal 192, and turns on a switch 142 by turning on a transistor 178, thereby switching the voltage of the terminal 194 to the voltage of the terminal 195. The switch 141 includes NMOS (n-channel metal-oxide-semiconductor) transistors 171 and 172, and the switch 142 includes NMOS transistors 175 and 176. A depression NMOS transistor 173 fixes levels of respective gates of the NMOS transistors 171 and 172 while the transistor 174 is in an off state. A depression NMOS transistor 177 fixes levels of respective gates of the NMOS transistors 175 and 176 while the transistor 178 is in an off state.

However, when the voltage of the terminal 195 increases while the switch 141 is turned off and the switch 142 is turned on, an npn parasitic transistor 170 is turned on. As a result, a leak electric current that flows from a terminal 191 coupled to the positive electrode of the power source to the terminal 194 via the parasitic transistor 170 is generated. When the leak electric current is generated, for example, the electric current consumption of the circuit increases.

FIG. 3 is a cross sectional diagram illustrating schematically an example of a structure of the switch 142 illustrated in FIG. 2. FIG. 3 is a diagram illustrating an example of an ON state of the switch 142 that is turned on by turning on the transistor 178. In the depression NMOS transistor 177 illustrated in FIG. 2, an electric current always flows when the transistor 178 is turned on. Accordingly, 177 in FIG. 3 indicates an ON resistance of the NMOS transistor 177.

In FIG. 3, the switch 142 formed on an N-type silicon substrate 180 includes the NMOS transistors 175 and 176. In the N-type silicon substrate 180, a back gate SUB formed of an n+ region 189 is formed, and the back gate SUB is coupled to the positive electrode of the power source. The NMOS transistor 175 includes a drain D formed of an n+ region 183, a source S formed of an n+ region 184 and a gate electrode 182. The source S of the n+ region 184 is coupled to a back gate BG formed of a p+ region 188. The NMOS transistor 176 includes a source S formed of an n+ region 187, a drain D formed of an n+ region 186 and a gate electrode 185. The source S formed of the n+ region 187 is coupled to the back gate BG formed of the p+ region 188. The n+ regions 183, 184, 186, and 187 and the p+ region 188 are in contact with and surrounded by a p-region 181 that is in contact with the N-type silicon substrate 180.

When the voltage of the V− terminal increases while the switch 142 is on, the npn parasitic transistor 170 is turned on. As a result, a leak current is generated and flows from the back gate SUB coupled to the positive electrode of the power source via the parasitic transistor 170 to the drain D formed of the n+ region 183, and flows to the terminal 194. Therefore, an electric current consumption of the circuit increases.

On the contrary, as illustrated in FIG. 4, when the voltage of the terminal 195 decreases while the switch 141 is off and the switch 142 is on, similarly to the cases of FIG. 2 and FIG. 3, the npn parasitic transistor 179 is turned on. FIG. 4 is a diagram illustrating an example of a case where the parasitic transistor 179 is turned on as a result of a decrease in the voltage of the terminal 195. When the npn parasitic transistor 179 is turned on, a leak current is generated and flows from the terminal 191 coupled to the positive electrode of the power source via the parasitic transistor 179 to the terminal 195. When the leak current is generated, for example, an electric current consumption of the circuit increases.

SUMMARY OF THE INVENTION

According to an aspect of this disclosure, there is provided a protection integrated circuit for controlling a metal-oxide-semiconductor transistor inserted in a power supply path between a secondary battery and a load to protect the secondary battery. The protection integrated circuit includes a bias output terminal connected to a back gate of the metal-oxide-semiconductor transistor, a load side terminal connected to the power supply path between the load and the metal-oxide-semiconductor transistor, a load side switch inserted in an electric current path connecting the bias output terminal and the load side terminal, and a control circuit configured to control the load side switch based on a state of the secondary battery and thereby cause a back gate control signal for controlling a voltage of the back gate to be output from the bias output terminal. The load side switch is formed on an N-type silicon substrate and includes at least two n-channel metal-oxide-semiconductor transistors whose drains are connected to each other, and the control circuit is configured to simultaneously turn on or turn off the two n-channel metal-oxide-semiconductor transistors based on the state of the secondary battery.

DESCRIPTION OF THE PREFERRED EMBODIMENTS

Embodiments of the present invention are described below with reference to the accompanying drawings. In the descriptions below, an NMOS transistor indicates an N-channel type MOS transistor, and a PMOS transistor indicates a P-channel type MOS transistor.

Figure 5:
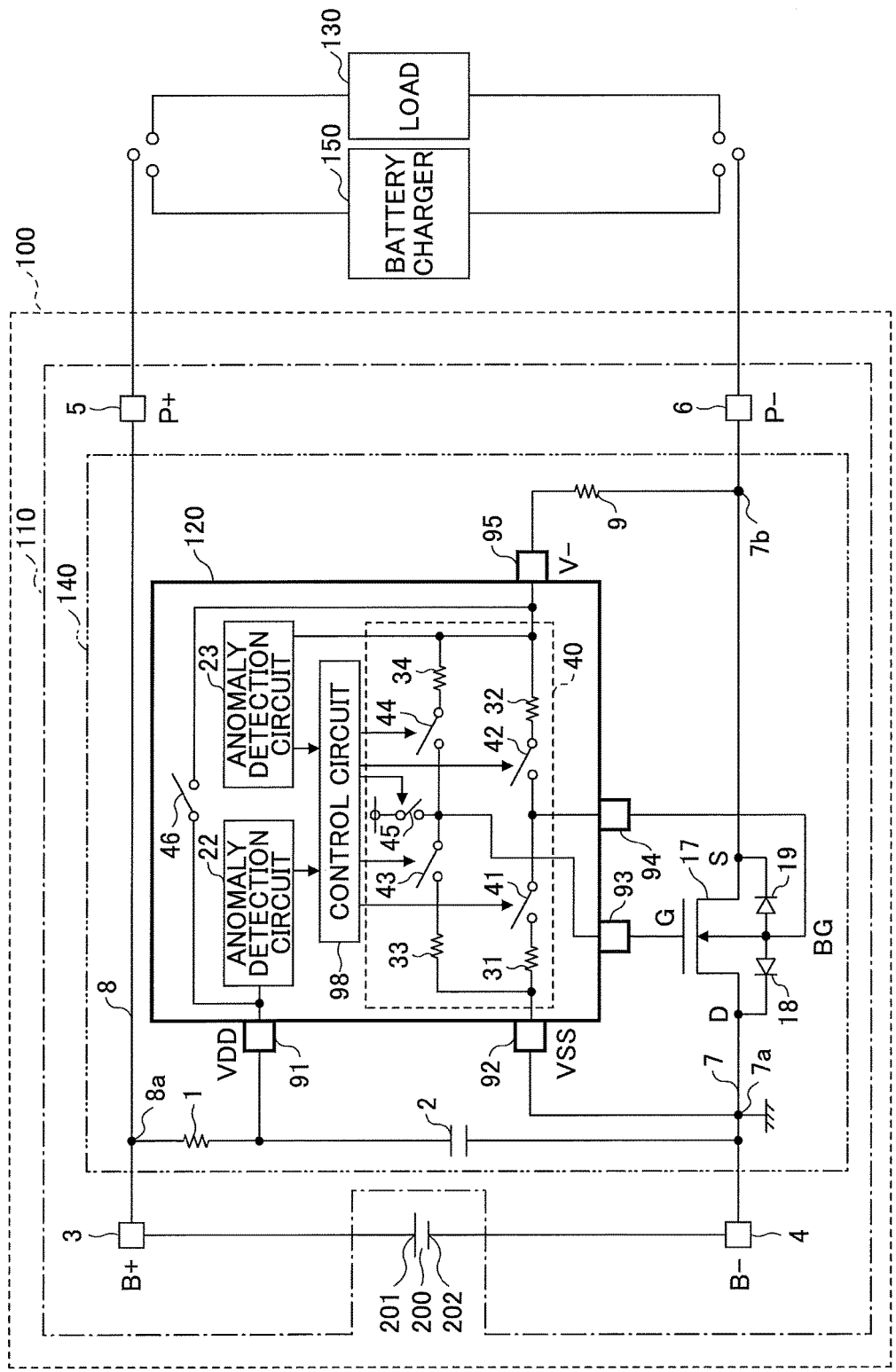
FIG. 5 is a diagram illustrating an example of a configuration of a battery pack.

FIG. 5 is a diagram illustrating an example of a configuration of a battery pack 100. The battery pack 100 includes a secondary battery 200 and a secondary battery protection device 110.

The secondary battery 200 is an example of a rechargeable battery. The secondary battery 200 can supply power to a load 130 that is coupled to a positive terminal 5 (P+ terminal) and a negative terminal 6 (P− terminal). The secondary battery 200 can be charged by a battery charger 150 coupled to the positive terminal 5 and the negative terminal 6. Examples of the secondary battery 200 include a lithium-ion battery and a lithium-polymer battery. The battery pack 100 may be included in the load 130 or externally attached to the load 130.

The load 130 is an example of a load that is supplied with power from the secondary battery 200 of the battery pack 100. Examples of the load 130 include electronic equipment such as a mobile terminal. Examples of mobile terminals include a mobile phone, a smartphone, a tablet computer, a gaming machine, a television set, a music or video player, and a camera.

The secondary battery protection device 110 is an example of a device that is driven by power supplied from the secondary battery 200, and protects the secondary battery 200 from, for example, overdischarge by controlling charging and discharging of the secondary battery 200. The secondary battery protection device 110 includes a charging-discharging control circuit 140, a battery positive electrode connection terminal 3 (B+ terminal), a battery negative electrode connection terminal 4 (B− terminal), a positive terminal 5, and a negative terminal 6.

The charging-discharging control circuit 140 is an example of a circuit that protects the secondary battery 200 from, for example, overdischarge by controlling charging and discharging of the secondary battery 200. The charging-discharging control circuit 140 includes a MOS (Metal Oxide Semiconductor) transistor 17, a secondary battery protection integrated circuit 120, a resistor 1, a capacitor 2, and a resistor 9.

The battery positive electrode connection terminal 3 is an example of a terminal coupled to a positive electrode 201 of the secondary battery 200. The battery negative electrode connection terminal 4 is an example of a terminal coupled to a negative electrode 202 of the secondary battery 200. The positive terminal 5 is an example of a terminal coupled to a positive terminal of the load 130 or the battery charger 150. The negative terminal 6 is an example of a terminal coupled to a negative terminal of the load 130 or the battery charger 150.

The battery positive electrode connection terminal 3 and the positive terminal 5 are connected via a positive power supply path 8, and the battery negative electrode connection terminal 4 and the negative terminal 6 are connected via a negative power supply path 7. The positive power supply path 8 is an example of a charging-discharging current path between the battery positive electrode connection terminal 3 and the positive terminal 5, and the negative power supply path 7 is an example of a charging-discharging current path between the battery negative electrode connection terminal 4 and the negative terminal 6.

The secondary battery protection device 110 includes the MOS transistor 17. The MOS transistor 17 is an example of a MOS field-effect transistor that is inserted in series in the negative power supply path 7 between a first negative connection point 7a and a second negative connection point 7b. When the MOS transistor 17 is turned off, the negative power supply path 7, through which a charging current or a discharging current of the secondary battery 200 flows, is blocked. The MOS transistor 17 is an example of an N-channel type MOS transistor.

The secondary battery protection device 110 includes the secondary battery protection integrated circuit 120. The secondary battery protection integrated circuit 120 is an example of a circuit that driven by power from the secondary battery 200, and protects the secondary battery 200 from, for example, overcurrent by controlling charging and discharging of the secondary battery 200. The secondary battery protection integrated circuit 120 is supplied with power from the secondary battery 200 and protects the secondary battery 200.

The secondary battery protection integrated circuit 120 is an example of a protection IC (integrated circuit), and includes, for example, a power source terminal 91, a ground terminal 92, a gate control terminal 93, a bias output terminal 94, and a detection terminal 95.

The power source terminal 91 is a positive power source terminal coupled to the positive electrode 201 of the secondary battery 200 via the positive connection point 8a and the battery positive electrode connection terminal 3, and may be referred to as a VDD terminal. The power source terminal 91 is, for example, connected to a connection point between an end of the resistor 1 whose another end is connected to the positive power supply path 8 and an end of the capacitor 2 whose another end is connected to the negative power supply path 7. The other end of the capacitor 2 is connected to the negative power supply path 7 at the first negative connection point 7a between the battery negative electrode connection terminal 4 and the MOS transistor 17.

The ground terminal 92 is a negative power source terminal coupled to the negative electrode 202 of the secondary battery 200 via the first negative connection point 7a and the battery negative electrode connection terminal 4, and may be referred to as a VSS terminal. The ground terminal 92 is coupled to the negative power supply path 7 at the first negative connection point 7a between the battery negative electrode connection terminal 4 and the MOS transistor 17. The ground terminal 92 is an example of a battery side terminal.

The gate control terminal 93 is a terminal that is coupled to a gate G of the MOS transistor 17, and outputs a control signal for controlling the gate G of the MOS transistor 17.

The bias output terminal 94 is a terminal that is coupled to a back gate BG of the MOS transistor 17 and is for determining a voltage of the back gate BG.

The detection terminal 95 is a terminal that is coupled to the negative terminal 6 coupled to a ground side terminal of the load 130, and may be referred to as a V− terminal. The detection terminal 95 is coupled to the negative power supply path 7 via the resistor 9 at a second negative connection point 7b between the negative terminal 6 and the MOS transistor 17. The detection terminal 95 is an example of a load side terminal.

The secondary battery protection integrated circuit 120 performs a protection process for the secondary battery 200 by controlling the MOS transistor 17. The secondary battery protection integrated circuit 120 includes a first anomaly detection circuit 22, a second anomaly detection circuit 23, switches 41 through 46, resistors 31 through 34, and a control circuit 98.

Each of the first anomaly detection circuit 22 and the second anomaly detection circuit 23 detects an anomaly in charging or discharging of the secondary battery 200, and includes, for example, a comparator for detecting the anomaly.

Figure 1:
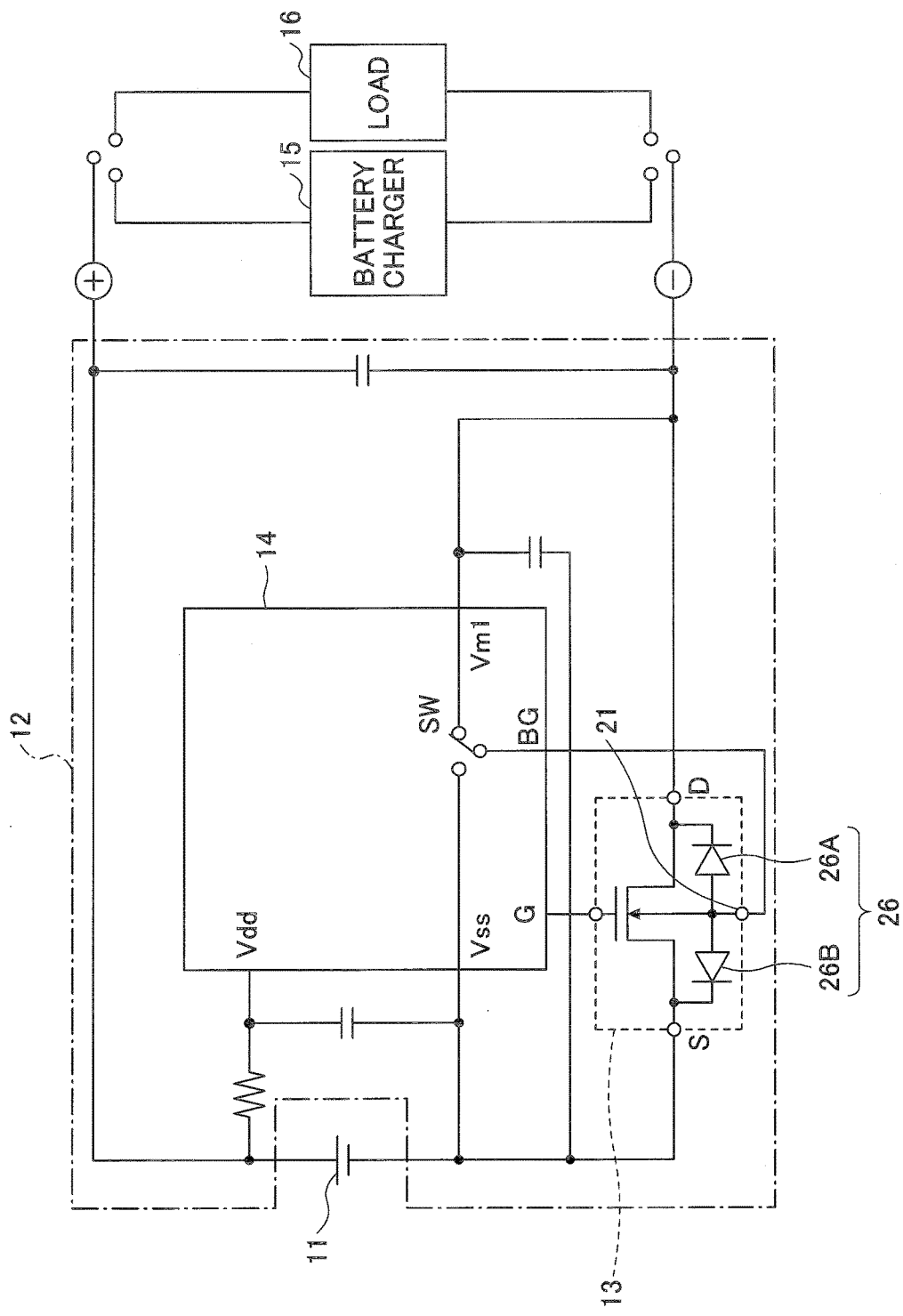
FIG. 1 is a diagram illustrating an example of a configuration of a related-art protection circuit.
Figure 2:
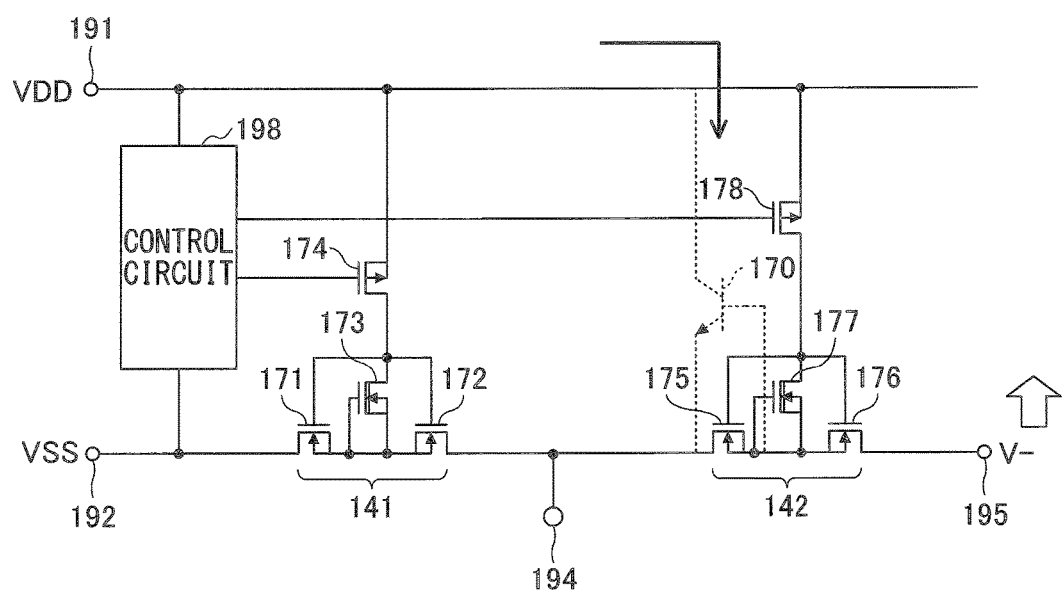
FIG. 2 is a diagram illustrating an example of a case where a parasitic transistor is turned on due to an increase of a voltage of a terminal.
Figure 3:
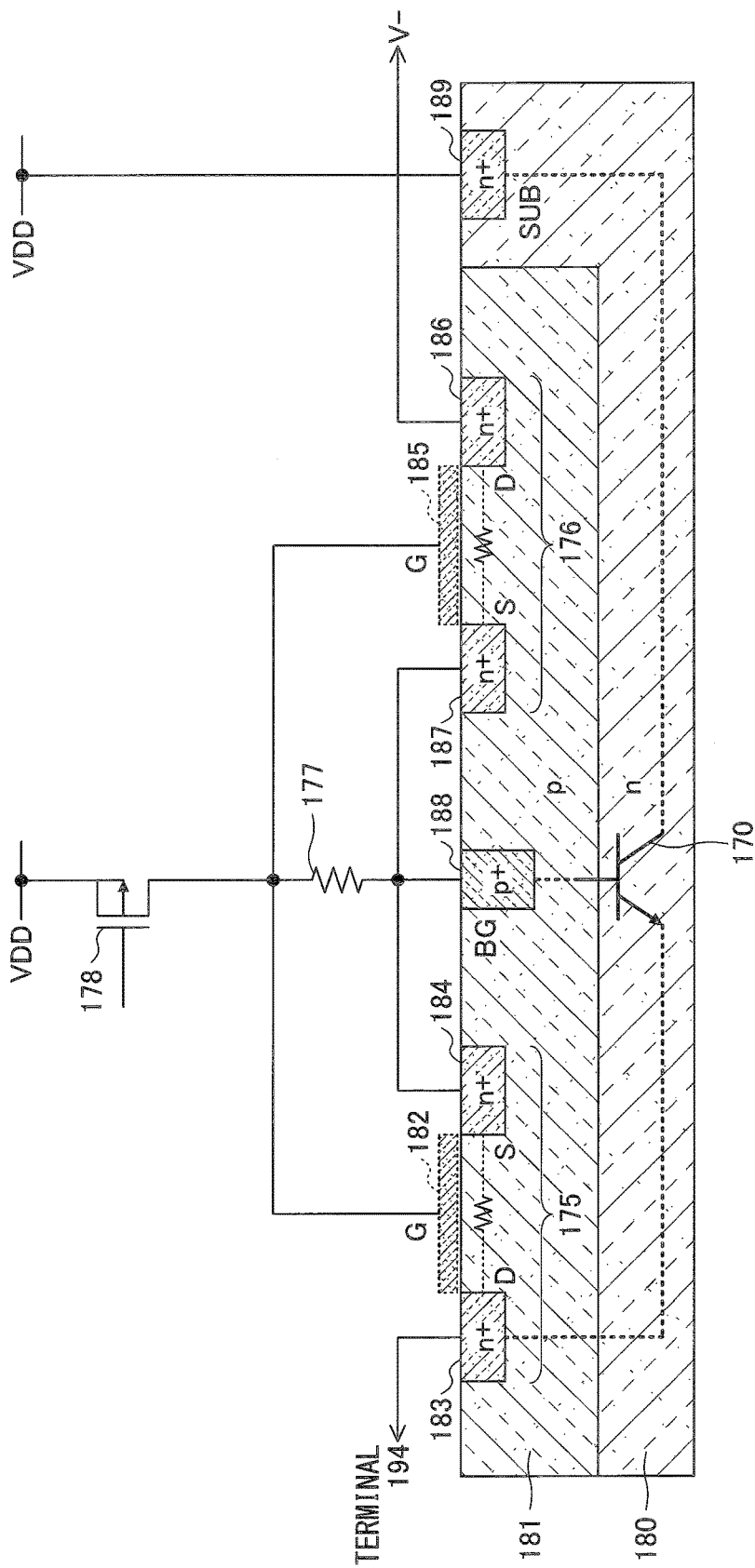
FIG. 3 is a cross-sectional diagram schematically illustrating an example of a structure of a switch illustrated in FIG. 2.
Figure 4:
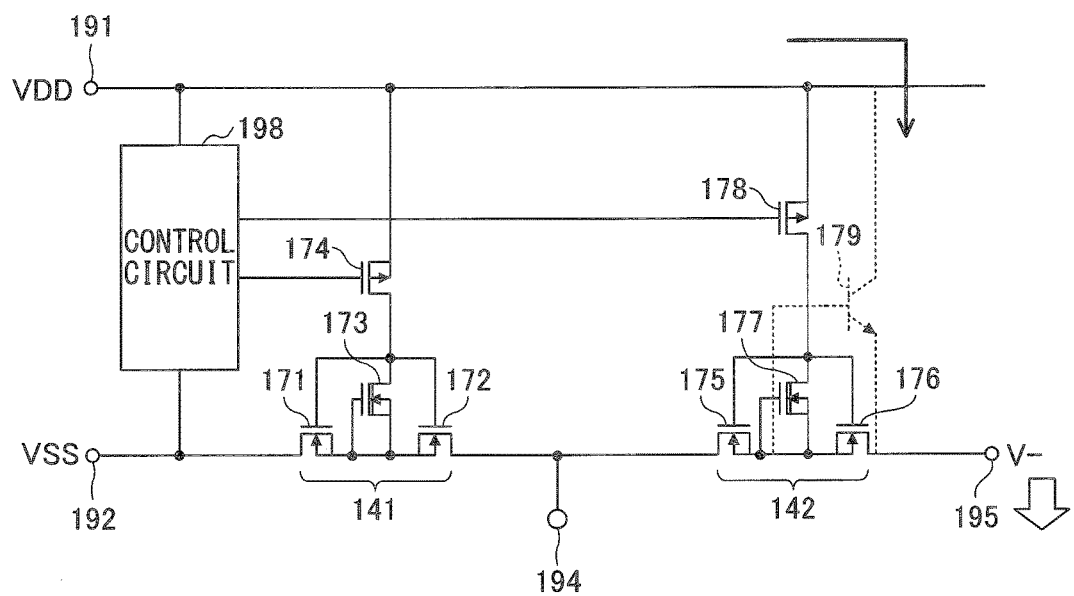
FIG. 4 is a diagram illustrating an example of a case where a parasitic transistor is turned on due to a decrease of a voltage of a terminal.

Based on an anomaly detection result by at least one of the first anomaly detection circuit 22 and the second anomaly detection circuit 23, the control circuit 98 outputs a switch control signal for controlling a switch control circuit 40, and controls on and off of the MOS transistor 17 via the switch control circuit 40. The control circuit 98 latches, for example, an output of the comparator that detects an anomaly of charging or discharging of the secondary battery 200, through a delay circuit. The control circuit 98 is implemented by, for example, a logic circuit. In FIG. 2, the switch control circuit 40 includes switches 41 through 45 and resistors 31 through 34.

The switch 41 and the resistor 31 are inserted in series in an electric current path that connects the bias output terminal 94 and the ground terminal 92 in the secondary battery protection integrated circuit 120. The switch 42 and the resistor 32 are inserted in series in an electric current path that connects the bias output terminal 94 and the detection terminal 95 in the secondary battery protection integrated circuit 120. The bias output terminal 94 is connected to an electric current path between the switch 41 and the switch 42 in the secondary battery protection integrated circuit 120.

The switch 43 and the resistor 33 are inserted in series in an electric current path that connects the gate control terminal 93 and the ground terminal 92 in the secondary battery protection integrated circuit 120. The switch 44 and the resistor 34 are inserted in series in an electric current path that connects the gate control terminal 93 and the detection terminal 95 in the secondary battery protection integrated circuit 120. The gate control terminal 93 is connected to an electric current path between the switch 43 and the switch 44 in the secondary battery protection integrated circuit 120, and coupled to a voltage of the power source terminal 91 via the switch 45 in the secondary battery protection integrated circuit 120.

The switch 46 is inserted in series in an electric current path that connects the detection terminal 95 and the power source terminal 91 in the secondary battery protection integrated circuit 120. When the switch 46 is turned on, the detection terminal 95 is pulled up to the voltage of the power source terminal 91.

The first anomaly detection circuit 22 monitors a battery voltage (cell voltage) of the secondary battery 200 by, for example, detecting a voltage between the power source terminal 91 and the ground terminal 92.

When detecting a cell voltage that is greater than or equal to a predetermined overcharge detection voltage Vdet1 by using a comparator, the first anomaly detection circuit 22 determines that an overcharge of the secondary battery 200 is detected, and outputs an overcharge detection signal. The overcharge of the secondary battery 200 represents an abnormal state where the secondary battery 200 is excessively charged (an example of an abnormal charging state of the secondary battery 200).

When detecting a cell voltage that is less than or equal to a predetermined overdischarge detection voltage Vdet2 by using the comparator, the first anomaly detection circuit 22 determines that an overdischarge of the secondary battery 200 is detected, and outputs an overdischarge detection signal. The overdischarge of the secondary battery 200 represents an abnormal state where the secondary battery 200 has excessively discharged (an example of an abnormal discharging state of the secondary battery 200).

The second anomaly detection circuit 23 monitors a voltage (sense voltage) between the negative terminal 6 and the battery negative electrode connection terminal 4 by, for example, detecting a voltage between the detection terminal 95 and the ground terminal 92.

When detecting a sense voltage that is greater than or equal to a predetermined over-discharging current detection voltage Vdet3 by using a comparator while the MOS transistor 17 is in the on state, the second anomaly detection circuit 23 determines that an over-discharging current of the secondary battery 200 is detected, and outputs an over-discharging current detection signal. The over-discharging current of the secondary battery 200 represents an abnormal state where an excessive discharging current flows in a discharging direction of the secondary battery 200 (an example of an abnormal discharging state of the secondary battery 200).

When detecting a sense voltage that is less than or equal to a predetermined over-charging current detection voltage Vdet4 by using a comparator while the MOS transistor 17 is in the on state, the second anomaly detection circuit 23 determines that an over-charging current of the secondary battery 200 is detected, and outputs an over-charging current detection signal. The over-charging current of the secondary battery 200 represents an abnormal state where an excessive charging current flows in a charging direction of the secondary battery 200 (an example of an abnormal charging state of the secondary battery 200).

While none of the abnormal charging state and the abnormal discharging state of the secondary battery 200 is detected by the first anomaly detection circuit 22 and the second anomaly detection circuit 23, the control circuit 98 outputs switch control signals to turn on the switch 41, turn off the switch 42, turn off the switch 43, turn off the switch 44, turn on the switch 45, and turn off the switch 46. Thus, the control circuit 98 turns on the switch 45 and thereby causes a gate control signal for turning on the MOS transistor 17 to be output via the switch control circuit 40 and the gate control terminal 93. Also, the control circuit 98 thereby connects the bias output terminal 94 with the ground terminal 92 within the secondary battery protection integrated circuit 120 without connecting the bias output terminal 94 with the detection terminal 95.

In other words, while none of the abnormal charging state and the abnormal discharging state of the secondary battery 200 is detected by the first anomaly detection circuit 22 and the second anomaly detection circuit 23, the control circuit 98 causes a gate control signal for turning on the MOS transistor 17 to be output via the switch control circuit 40 and the gate control terminal 93, and causes a back gate control signal with a voltage of the ground terminal 92 to be output via the switch control circuit 40 and the bias output terminal 94. As a result, the MOS transistor 17 is turned on, and the back gate BG of the MOS transistor 17 is coupled to the drain D of the MOS transistor 17 via the switch 41 and the ground terminal 92.

The gate control signal controls the gate of the MOS transistor. The back gate control signal controls the voltage of the back gate BG. By the back gate control signal, the voltage of the back gate BG is clamped.

Accordingly, when the battery charger 150 is connected, a charging current, which flows in the charging direction of the secondary battery 200, flows via the MOS transistor 17 in the on state. In contrast, when the load 130 is connected, a discharging current, which flows in the discharging direction of the secondary battery 200, flows via the MOS transistor 17 in the on state.

When an abnormal charging state of the secondary battery 200 is detected by the first anomaly detection circuit 22 or the second anomaly detection circuit 23, the control circuit 98 outputs switch control signals to turn off the switch 41, turn on the switch 42, turn off the switch 43, turn on the switch 44, and turn off the switch 45. The control circuit 98 thereby causes a gate control signal for turning off the MOS transistor 17 to be output via the switch control circuit 40 and the gate control terminal 93, and connects the bias output terminal 94 with the detection terminal 95 within the secondary battery protection integrated circuit 120 without connecting the bias output terminal 94 with the ground terminal 92.

In other words, when an abnormal charging state of the secondary battery 200 is detected by the first anomaly detection circuit 22 or the second anomaly detection circuit 23, the control circuit 98 causes a gate control signal for turning off the MOS transistor 17 to be output via the switch control circuit 40 and the gate control terminal 93, and causes a back gate control signal with a voltage of the detection terminal 95 to be output via the switch control circuit 40 and the bias output terminal 94. As a result, the MOS transistor 17 is turned off, and the back gate BG of the MOS transistor 17 is connected to the source S of the MOS transistor 17 via the switch 42 and the detection terminal 95.

Accordingly, even when the battery charger 150 is connected while the secondary battery 200 is in the abnormal charging state, the charging current flowing in the charging direction of the secondary battery 200 is blocked by the MOS transistor 17 in the off state and a parasitic diode 18. In contrast, when the load 130 is connected while the secondary battery 200 is in the abnormal charging state, the discharging current flowing in the discharging direction of the secondary battery 200 flows through the negative terminal 6, the resistor 9, the detection terminal 95, the resistor 32, the switch 42, the bias output terminal 94, the back gate BG, the parasitic diode 18, and the battery negative electrode connection terminal 4 in this order. The parasitic diode 18 is formed between the back gate BG and the drain D of the MOS transistor 17.

Here, the current value of the discharging current in the abnormal charging state of the secondary battery 200 is limited by the on resistance of the switch 42, the resistor 32, and the resistor 9. However, it is possible to reduce an increase in the chip area by making the impedance of a first control line (specifically, an electric current path between the bias output terminal 94 and the detection terminal 95) greater than the on resistance value of the MOS transistor 17. This also makes it easier to design a driver circuit for driving the switch 42. For example, a chip area required for mounting the switch 42 can be limited to about 0.1 mm square by implementing the switch 42 with a FET having an on resistance value in the order of several kΩ that is greater than the on resistance value in the order of several mΩ of the MOS transistor 17.

As described above, in the secondary battery protection integrated circuit 120, when the bias output terminal 94 and the detection terminal 95 are coupled to each other via the switch 42, the resistance value between the bias output terminal 94 and the detection terminal 95 is greater than the on resistance value of the MOS transistor 17. This makes it possible to reduce an increase in the circuit area of the secondary battery protection integrated circuit 120.

Also, the resistor 32 is inserted in series in the electric current path between the bias output terminal 94 and the detection terminal 95. The resistance value of the resistor 32 makes it easier to set the resistance between the bias output terminal 94 and the detection terminal 95 at a high value when they are connected via the switch 42.

When overcharging of the secondary battery 200 is detected by the first anomaly detection circuit 22, the control circuit 98 may turn on the switch 46. As a result, electric charges of the secondary battery 200 in the overcharging state are discharged to the battery negative electrode connection terminal 4 via the power source terminal 91, the switch 46 in the on state, the resistor 32, the switch 42 in the on state, the bias output terminal 94, the back gate BG, and the parasitic diode 18. This makes it possible to quickly correct the overcharging state of the secondary battery 200. The switch 46 is an example of a discharging circuit that discharges electric charges of the secondary battery 200 to the detection terminal 95 when overcharging of the secondary battery 200 is detected.

When an abnormal discharging state of the secondary battery 200 is detected by the first anomaly detection circuit 22 or the second anomaly detection circuit 23, the control circuit 98 turns on the switch 41, turns off the switch 42, turns on the switch 43, turns off the switch 44, and turns off the switch 45. The control circuit 98 thereby causes a control signal for turning off the MOS transistor 17 to be output via the switch control circuit 40 and the gate control terminal 93, and connects the bias output terminal 94 with the ground terminal 92 within the secondary battery protection integrated circuit 120 without connecting the bias output terminal 94 with the detection terminal 95.

In other words, when the abnormal discharging state of the secondary battery 200 is detected by the first anomaly detection circuit 22 or the second anomaly detection circuit 23, the control circuit 98 causes a gate control signal for turning off the MOS transistor 17 to be output via the switch control circuit 40 and the gate control terminal 93, and causes a back gate control signal with a voltage of the ground terminal 92 to be output via the bias output terminal 94. As a result, the MOS transistor 17 is turned off, and the back gate BG of the MOS transistor 17 is coupled to the drain D of the MOS transistor 17 via the switch 41 and the ground terminal 92.

With the above configuration, even when the load 130 is connected while the secondary battery 200 is in the abnormal discharging state, the discharging current flowing in the discharging direction of the secondary battery 200 is blocked by the MOS transistor 17 in the off state and a parasitic diode 19. In contrast, when the battery charger 150 is connected while the secondary battery 200 is in the abnormal discharging state, the charging current flowing in the charging direction of the secondary battery 200 flows through the battery negative electrode connection terminal 4, the ground terminal 92, the resistor 31, the switch 41, the bias output terminal 94, the back gate BG, the parasitic diode 19, and the negative terminal 6 in this order. The parasitic diode 19 is formed between the back gate BG and the source S of the MOS transistor 17.

Here, while the secondary battery 200 is in the abnormal discharging state, the current value of the charging current is limited by the on resistance of the switch 41 and the resistor 31. However, it is possible to reduce an increase in the chip area by making the impedance of a second control line (specifically, an electric current path between the bias output terminal 94 and the ground terminal 92) greater than the on resistance value of the MOS transistor 17. This also makes it easier to design a driver circuit for driving the switch 41. For example, a chip area required for mounting the switch 41 can be limited to about 0.1 mm square by implementing the switch 41 with a FET having an on resistance value in the order of several kΩ that is greater than the on resistance value in the order of several mΩ of the MOS transistor 17.

As described above, in the secondary battery protection integrated circuit 120, when the bias output terminal 94 and the ground terminal 92 are coupled to each other via the switch 41, the resistance value between the bias output terminal 94 and the ground terminal 92 is greater than the on resistance value of the MOS transistor 17. This makes it possible to reduce an increase in the circuit area of the secondary battery protection integrated circuit 120.

Also, the resistor 31 is inserted in series in the electric current path between the bias output terminal 94 and the ground terminal 92. The resistance value of the resistor 31 makes it easier to set the resistance value between the bias output terminal 94 and the ground terminal 92 at a high value when they are connected via the switch 41.

Figure 6:
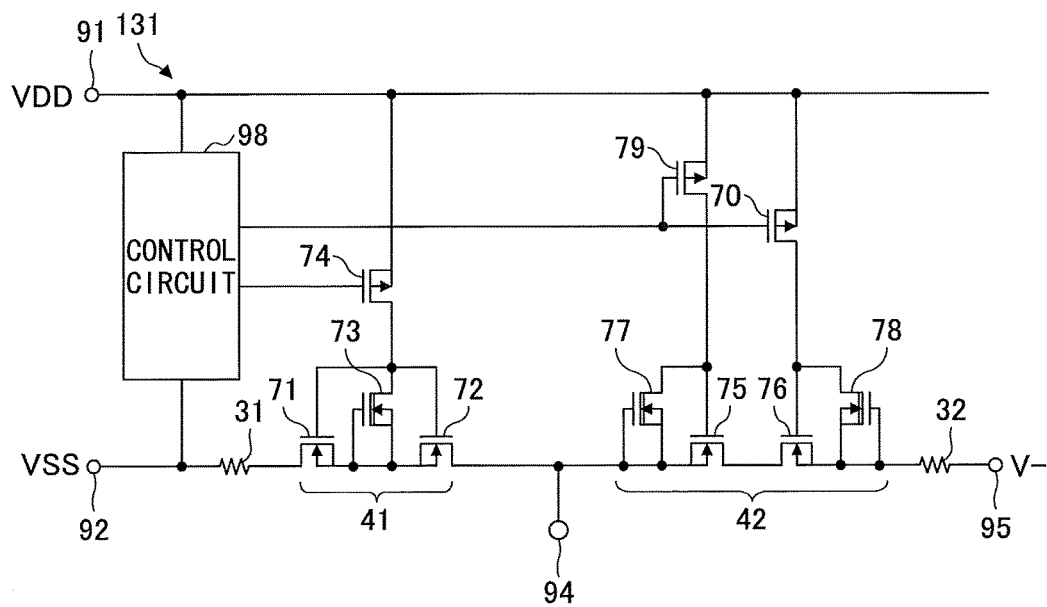
FIG. 6 is a diagram illustrating an example of a configuration of a switch circuit that switches voltages of a back gate.

FIG. 6 is a diagram illustrating an example of a configuration of a switch circuit 131 for switching voltages of the back gate. The switch circuit 131 is an example of a semiconductor integrated circuit that selectively switches the voltage of the back gate BG of the MOS transistor 17 coupled to the bias output terminal 94 (See FIG. 5) to the voltage of the ground terminal 92 or the voltage of the detection terminal 95.

The back gate BG of the MOS transistor 17 is an example of a high impedance node. The bias output terminal 94 is an example of a first terminal coupled to the high impedance node. The detection terminal 95 is an example of a second terminal coupled to another node (e.g. the second negative connection point 7b) different from the high impedance node.

The control circuit 98 switches the voltage of the bias output terminal 94 to the voltage of the ground terminal 92 by turning on the switch 41 using a transistor 74, and switches the voltage of the bias output terminal 94 to the voltage of the detection terminal 95 by turning on the switch 42 using transistors 70 and 79.

The switch 41 is an example of a battery side switch that is inserted in series in an electric current path connecting the bias output terminal 94 and the ground terminal 92. The switch 42 is an example of a load side switch that is inserted in series in an electric current path connecting the bias output terminal 94 and the detection terminal 95.

The switch 41 includes at least two NMOS transistors 71 and 72 whose sources are connected to each other. The switch 42 includes at least two NMOS transistors 75 and 76 whose drains are connected to each other. A depression NMOS transistor 73 fixes levels of respective gates of the NMOS transistors 71 and 72 in an off state of the transistor 74. A depression NMOS transistor 77 fixes a level of a gate of the NMOS transistor 75 in an off state of the transistor 79. A depression NMOS transistor 78 fixes a level of a gate of the transistor 76 in an off state of the transistor 70.

The transistors 79 and 70 are an example of a signal input unit to which a signal for simultaneously turning on or off the two NMOS transistors 75 and 76 is input. The gate of the transistor 79 and the gate of the transistor 70 are commonly coupled to the control circuit 98. The transistor 79 is an example of a PMOS transistor including a source connected to a voltage of the power source terminal 91 and a drain connected to the gate of the NMOS transistor 75. The transistor 70 is an example of a PMOS transistor including a source connected to the voltage of the power source terminal 91 and a drain connected to the gate of the NMOS transistor 76.

When none of the abnormal charging state and the abnormal discharging state of the secondary battery 200 is detected by the first anomaly detection circuit 22 and the second anomaly detection circuit 23, the control circuit 98 turns on the transistor 74, and thereby turns on the NMOS transistors 71 and 72 simultaneously. As a result, the switch 41 is turned on. Also, when none of the abnormal charging state and abnormal discharging state of the secondary battery 200 is detected by the first anomaly detection circuit 22 and the second anomaly detection circuit 23, the control circuit 98 turns off the transistors 79 and 70 simultaneously, and thereby turns off the NMOS transistors 75 and 76 simultaneously. As a result, the switch 42 is turned off.

When the abnormal charging state of the secondary battery 200 is detected by the first anomaly detection circuit 22 or the second anomaly detection circuit 23, the control circuit 98 turns off the transistor 74, and thereby turns off the NMOS transistors 71 and 72 simultaneously. As a result, the switch 41 is turned off. Also, when the abnormal charging state of the secondary battery 200 is detected by the first anomaly detection circuit 22 or the second anomaly detection circuit 23, the control circuit 98 turns on the transistors 79 and 70 simultaneously, and thereby turns on the NMOS transistors 75 and 76 simultaneously. As a result, the switch 42 is turned on.

When the abnormal discharging state of the secondary battery 200 is detected by the first anomaly detection circuit 22 or the second anomaly detection circuit 23, the control circuit 98 turns on the transistor 74, and thereby turns on the NMOS transistors 71 and 72 simultaneously. As a result, the switch 41 is turned on. Also, when the abnormal charging state of the secondary battery 200 is detected by the first anomaly detection circuit 22 or the second anomaly detection circuit 23, the control circuit 98 turns off the transistors 79 and 70 simultaneously, and thereby turns off the NMOS transistors 75 and 76 simultaneously. As a result, the switch 42 is turned off.

Figure 7:
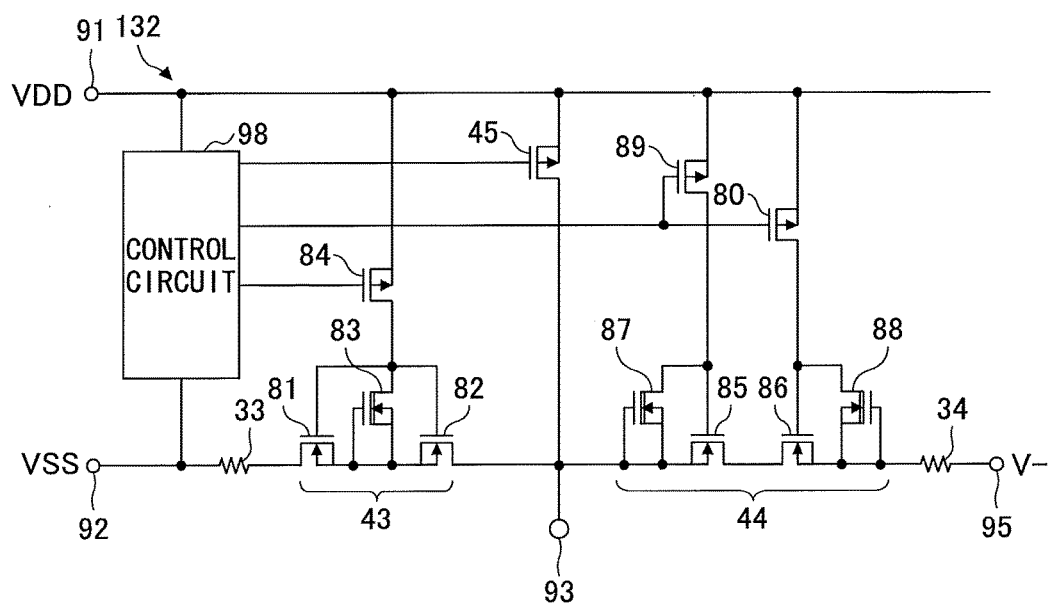
FIG. 7 is a diagram illustrating an example of a configuration of a switch circuit that switches voltages of a gate.

FIG. 7 is a diagram illustrating an example of a configuration of a switch circuit 132 that switches voltages of the gate. The switch circuit 132 is an example of a semiconductor integrated circuit that selectively switches the voltage of the gate G of the MOS transistor 17 (See FIG. 5) coupled to the gate control terminal 93 to the voltage of the ground terminal 92 or the voltage of the detection terminal 95.

The gate G of the MOS transistor 17 is an example of a high impedance node. The gate control terminal 93 is an example of a first terminal coupled to the high impedance node. The detection terminal 95 is an example of a second terminal coupled to another node (e.g. the second negative connection point 7b) different from the high impedance node.

The control circuit 98 turns on the switch 43 by using a transistor 84, and thereby switches the voltage of the gate control terminal 93 to the voltage of the ground terminal 92. Also, the control circuit 98 turns on the switch 44 by using transistors 80 and 89, and thereby switches the voltage of the gate control terminal 93 to the voltage of the detection terminal 95. In this case, the switch 45 is in the off state.

The switch 45 is an example of a pull up circuit that pulls up the gate control terminal 93. The switch 45 is an example of a PMOS transistor including a gate coupled to the control circuit 98, a source coupled to a voltage of the power source terminal 91, and a drain coupled to the gate control terminal 93.

The switch 43 is an example of a battery side switch inserted in series in an electric current path that connects the gate control terminal 93 with the ground terminal 92. The switch 44 is an example of a load side switch inserted in series in an electric current path that connects the gate control terminal 93 with the detection terminal 95.

The switch 43 includes at least two NMOS transistors 81 and 82 whose sources are connected to each other. The switch 44 includes at least two NMOS transistors 85 and 86 whose drains are connected to each other. A depression NMOS transistor 83 fixes levels of respective gates of the NMOS transistors 81 and 82 in an off state of the transistor 84. A depression NMOS transistor 87 fixes a level of a gate of the NMOS transistor 85 in an off state of the transistor 89. A depression NMOS transistor 88 fixes a level of a gate of the NMOS transistor 86 in an off state of the transistor 80.

The transistors 89 and 80 are an example of a signal input unit to which a signal for simultaneously turning on or off the two NMOS transistors 85 and 86 is input. The gate of the transistor 89 and the gate of the transistor 80 are commonly coupled to the control circuit 98. The transistor 89 is an example of a PMOS transistor including a source connected to a voltage of the power source terminal 91 and a drain connected to the gate of the NMOS transistor 85. The transistor 80 is an example of a PMOS transistor including a source connected to the voltage of the power source terminal 91 and a drain connected to the gate of the NMOS transistor 86.

When none of the abnormal charging state and the abnormal discharging state of the secondary battery 200 is detected by the first anomaly detection circuit 22 and the second anomaly detection circuit 23, the control circuit 98 turns off the transistor 84, and thereby turns off the NMOS transistors 81 and 82 simultaneously. As a result, the switch 43 is turned off. Also, when none of the abnormal charging state and the abnormal discharging state of the secondary battery 200 is detected by the first anomaly detection circuit 22 and the second anomaly detection circuit 23, the control circuit 98 turns off the transistors 89 and 80 simultaneously, and thereby turns off the NMOS transistors 85 and 86 simultaneously. As a result, the switch 44 is turned off.

In contrast, when the abnormal charging state of the secondary battery 200 is detected by the first anomaly detection circuit 22 or the second anomaly detection circuit 23, the control circuit 98 turns off the transistor 84, and thereby turns off the NMOS transistors 81 and 82 simultaneously. As a result, the switch 43 is turned off. Also, when the abnormal charging state of the secondary battery 200 is detected by the first anomaly detection circuit 22 or the second anomaly detection circuit 23, the control circuit 98 turns on the transistors 89 and 80 simultaneously, and thereby turns on the NMOS transistors 85 and 86 simultaneously. As a result, the switch 44 is turned on.

When the abnormal discharging state of the secondary battery 200 is detected by the first anomaly detection circuit 22 or the second anomaly detection circuit 23, the control circuit 98 turns on the transistor 84, and thereby turns on the NMOS transistors 81 and 82 simultaneously. As a result, the switch 43 is turned on. Also, when the abnormal charging state of the secondary battery 200 is detected by the first anomaly detection circuit 22 or the second anomaly detection circuit 23, the control circuit 98 turns off the transistors 89 and 80 simultaneously, and thereby turns off the NMOS transistors 85 and 86 simultaneously. As a result, the switch 44 is turned off.

Figure 8:
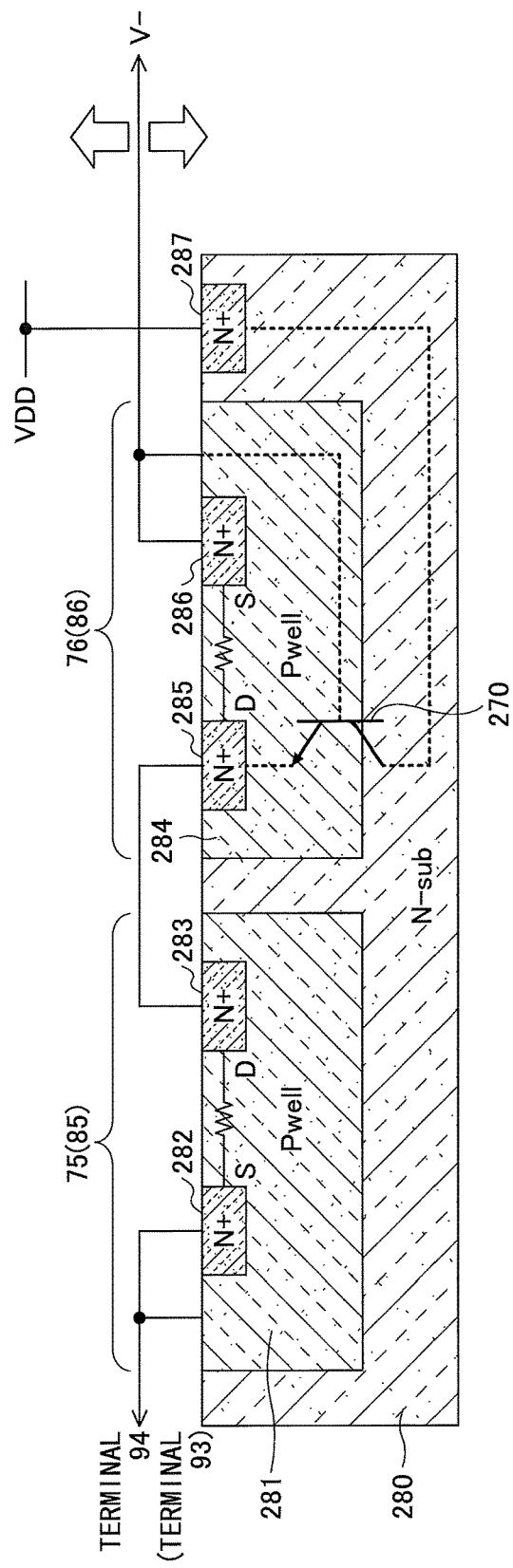
FIG. 8 is a cross-sectional diagram schematically illustrating an example of a structure of a switch illustrated in FIG. 6 or FIG. 7.

FIG. 8 is a cross-sectional diagram schematically illustrating an example of a structure of the switch 42 illustrated in FIG. 6 or the switch 44 illustrated in FIG. 7, and illustrates the on state of the switch 42 or the switch 44.

In FIG. 8, the switch 42 formed on an N-type silicon substrate 280 includes the NMOS transistors 75 and 76, and the switch 44 formed on the N-type silicon substrate 280 includes the NMOS transistors 85 and 86. A back gate SUB implemented by the n+ region 287 is formed in the N-type silicon substrate 280. The back gate SUB is coupled to a voltage of the positive electrode of the power source.

The NMOS transistor 75 includes a drain D formed of an n+ region 283, a source S formed of an n+ region 282, and a gate electrode. The source S of the n+ region 282 is coupled to a back gate BG of a p-well region 281. The NMOS transistor 76 includes a source S formed of an n+ region 286, a drain D formed of an n+ region 285, and a gate electrode. The source S formed of the n+ region 286 is coupled to a back gate BG of a p-well region 284. The n+ regions 282 and 283 are surrounded by the p-well region 281 that contacts the N-type silicon substrate 280. The drain D of the n+ region 283 and the drain D of the n+ region 285 are connected to each other via wiring.

A npn parasitic transistor 270 functions using the p-well region 284 as a base, the N-type silicon substrate 280 as a collector, and the n+ region 285 as an emitter. In the case where the voltage of the V− terminal increases, the parasitic transistor 270 is turned on and a leak current flows between the collector and the emitter under a condition where the NMOS transistor 75 is turned on and the NMOS transistor 76 is turned off. Also, in the case where the voltage of V− terminal decreases, the parasitic transistor 270 is turned on and a leak current flows between the collector and the emitter under a condition where the NMOS transistor 75 is turned off and the NMOS transistor 76 is turned on.

In the present embodiment, however, the NMOS transistors 75 and 76 are simultaneously turned on or simultaneously turned off as described above. Therefore, even when the voltage of the V− terminal increases or decreases, the parasitic transistor 270 is not turned on and the flow of a leak current to the bias output terminal 94 can be prevented. This makes it possible to prevent the leak current from causing fluctuation of the operating point of the MOS transistor 17 whose back gate is coupled to the bias output terminal 94. Also, preventing the leak current makes it possible to reduce an increase in the electric current consumption of the secondary battery protection integrated circuit 120.

Because the configuration and operation of the NMOS transistors 85 and 86 are substantially the same as those of the NMOS transistors 75 and 76, similar effects can also be achieved for the NMOS transistors 85 and 86. That is, even if the voltage of the V− terminal increases or decreases, the parasitic transistor 270 is not turned on, and the flow of a leak current to the gate control terminal 93 can be prevented.

Figure 9:
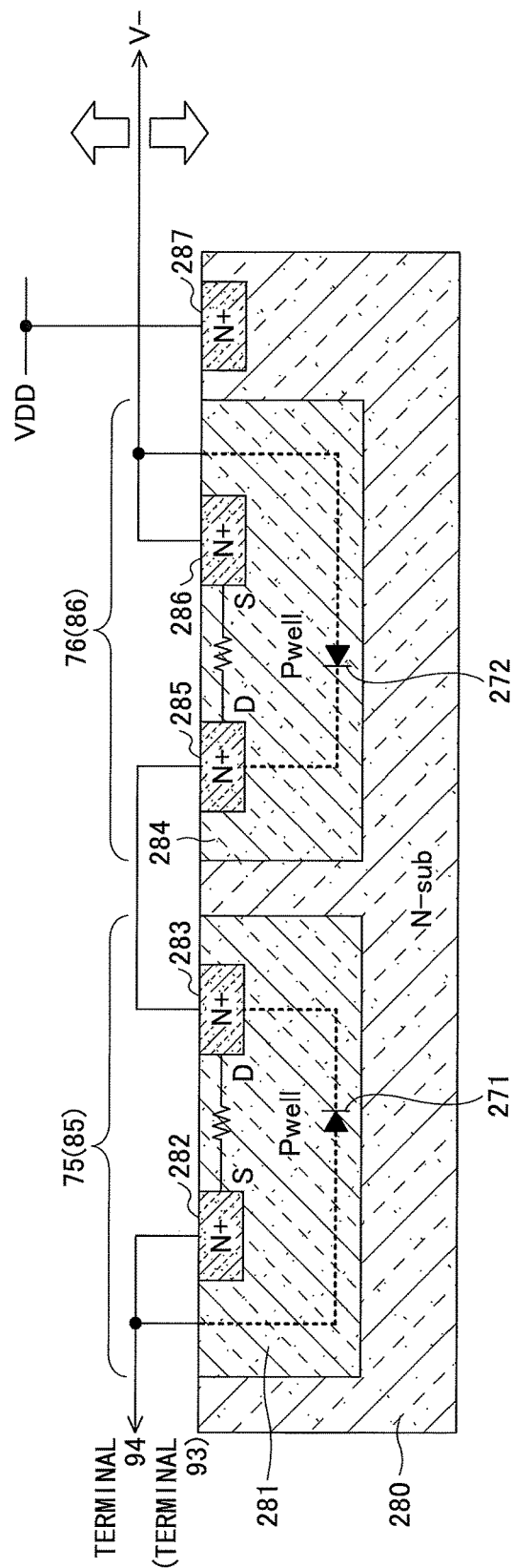
FIG. 9 is a cross-sectional diagram schematically illustrating another example of a structure of a switch illustrated in FIG. 6 or FIG. 7.

FIG. 9 is a cross-sectional diagram schematically illustrating an example of a structure of the switch 42 illustrated in FIG. 6 or the switch 44 illustrated in FIG. 7, and illustrates an example of the off state of the switch 42 or the switch 44.

Because the NMOS transistors 75 and 76 are simultaneously turned off, the forward direction of a parasitic diode 271 between the source and the drain of the NMOS transistor 75 becomes the opposite of the forward direction of a parasitic diode 272 between the source and the drain of the NMOS transistor 76. Therefore, the electric current path between the V-terminal and the bias output terminal 94 is blocked. This also applies to the NMOS transistors 85 and 86.

An aspect of this disclosure makes it possible to reduce a leak current caused by a parasitic transistor.

A protection IC and a semiconductor integrated circuit according to embodiments are described above. However, the present invention is not limited to the specifically disclosed embodiments, and variations and modifications may be made without departing from the scope of the present invention. Also, the above-described embodiments may be combined in any appropriate manner.

What is claimed is:

1. A protection integrated circuit for controlling a metal-oxide-semiconductor transistor inserted in a power supply path between a secondary battery and a load to protect the secondary battery, the protection integrated circuit comprising:
    a bias output terminal connected to a back gate of the metal-oxide-semiconductor transistor;
    a load side terminal connected to the power supply path between the load and the metal-oxide-semiconductor transistor;
    a load side switch inserted in an electric current path connecting the bias output terminal and the load side terminal; and
    a control circuit configured to control the load side switch based on a state of the secondary battery, and thereby cause a back gate control signal for controlling a voltage of the back gate to be output from the bias output terminal, wherein
    the load side switch is formed on an N-type silicon substrate and includes at least two n-channel metal-oxide-semiconductor transistors whose drains are connected to each other; and
    the control circuit is configured to simultaneously turn on or turn off the two n-channel metal-oxide-semiconductor transistors based on the state of the secondary battery.

2. The protection integrated circuit according to claim 1, further comprising:
    a battery side terminal connected to the power supply path between the secondary battery and the metal-oxide-semiconductor transistor; and
    a battery side switch inserted in an electric current path connecting the bias output terminal and the battery side terminal,
    wherein the control circuit is configured to turn off the two n-channel metal-oxide-semiconductor transistors when the battery side switch is turned on, and turn on the two n-channel metal-oxide-semiconductor transistors when the battery side switch is turned off.

3. A protection integrated circuit for controlling a metal-oxide-semiconductor transistor inserted in a power supply path between a secondary battery and a load to protect the secondary battery, the protection integrated circuit comprising:
    a gate control terminal connected to a gate of the metal-oxide-semiconductor transistor;
    a load side terminal connected to the power supply path between the load and the metal-oxide-semiconductor transistor;
    a load side switch inserted in an electric current path connecting the gate control terminal and the load side terminal;
    a pull-up circuit configured to pull up the gate control terminal; and
    a control circuit configured to control the load side switch and the pull-up circuit based on a state of the secondary battery, and thereby cause a gate control signal for controlling a voltage of the gate to be output from the gate control terminal, wherein
    the load side switch is formed on an N-type silicon substrate and includes at least two n-channel metal-oxide-semiconductor transistors whose drains are connected to each other; and
    the control circuit is configured to simultaneously turn on or turn off the two n-channel metal-oxide-semiconductor transistors based on the state of the secondary battery.

4. The protection integrated circuit according to claim 3, further comprising:
    a battery side terminal connected to the power supply path between the secondary battery and the metal-oxide-semiconductor transistor; and
    a battery side switch inserted in an electric current path connecting the gate control terminal and the battery side terminal,
    wherein the control circuit is configured to turn off the two n-channel metal-oxide-semiconductor transistors when the battery side switch is turned on, and turn on the two n-channel metal-oxide-semiconductor transistors when the battery side switch is turned off.

5. A semiconductor integrated circuit for switching voltages of a high impedance node, the semiconductor integrated circuit comprising:
a first terminal coupled to the high impedance node;
a second terminal connected to another node different from the high impedance node;
two n-channel metal-oxide-semiconductor transistors formed on an N-type silicon substrate and inserted between the first terminal and the second terminal, drains of the two n-channel metal-oxide-semiconductor transistors being connected to each other; and
a signal input unit to which a signal for simultaneously turning on or turning off the two n-channel metal-oxide-semiconductor transistors is input.

6. The semiconductor integrated circuit according to claim 5,
wherein the high impedance node is a back gate or a gate of a metal-oxide-semiconductor transistor.

* * * * *